United States Patent
Smith et al.

(10) Patent No.: US 6,187,211 B1
(45) Date of Patent: Feb. 13, 2001

(54) METHOD FOR FABRICATION OF MULTI-STEP STRUCTURES USING EMBEDDED ETCH STOP LAYERS

(75) Inventors: Donald L. Smith, Palo Alto; James C. Mikkelsen, Jr., Los Altos; Babur B. Hadimioglu, Mountain View; Martin G. Lim, San Mateo, all of CA (US)

(73) Assignee: Xerox Corporation, Stamford, CT (US)

( * ) Notice: Under 35 U.S.C. 154(b), the term of this patent shall be extended for 0 days.

(21) Appl. No.: 09/211,781

(22) Filed: Dec. 15, 1998

(51) Int. Cl.⁷ .............................. B29D 11/00; G02B 1/10
(52) U.S. Cl. ................... 216/26; 216/72; 216/24; 359/584; 359/355; 359/472; 430/321; 430/323
(58) Field of Search ...................... 216/26, 24, 67, 216/72, 79, 2, 41, 47, 16, 27; 430/321, 323; 359/584, 355, 742; 427/569, 585, 588, 96, 99

(56) References Cited

U.S. PATENT DOCUMENTS

| | | |
|---|---|---|
| 4,751,529 | 6/1988 | Elrod et al. . |
| 4,751,530 | 6/1988 | Elrod et al. . |
| 4,895,790 * | 1/1990 | Swanson et al. ............. 430/321 |
| 5,041,849 | 8/1991 | Quate et al. . |
| 5,161,059 * | 11/1992 | Swanson et al. ............. 359/565 |
| 5,218,471 * | 6/1993 | Swanson et al. ............. 359/565 |
| 5,278,028 | 1/1994 | Hadimioglu et al. . |
| 5,779,751 | 7/1998 | Wong . |

OTHER PUBLICATIONS

Swanson et al., "Infrared Applications of Deffractive Optical Elements," *Holographic Optics: Design and Applications*, SPIE vol. 883, 1988, pp. 155–162.

* cited by examiner

Primary Examiner—Gregory Mills
Assistant Examiner—P. Hassanzadeh
(74) Attorney, Agent, or Firm—Fay, Sharpe, Fagan, Minnich & McKee, LLP (57) ABSTRACT

A method of fabrication is provided for multi-step microlithographic structures including Fresnel lenses whereby the process includes the formation of intermediate etch stop layers that are embedded with the structure material. This is accomplished in one aspect of the invention by depositing Fresnel lens material using known techniques and the selectively altering the chemistry of the material being deposited to form the intermediate etch stop layers at suitable positions without interrupting the deposition process. In another aspect, etch stop layers are patterned on layers of the lens material and embedded between such layers. The structure, or lens, is then formed using masking, patterning and etching techniques.

22 Claims, 7 Drawing Sheets

FIG. 1
CONVENTIONAL

FIG. 2
CONVENTIONAL

FIG. 3(a)
CONVENTIONAL

FIG. 3(b)
CONVENTIONAL

FIG. 3(c)
CONVENTIONAL

FIG. 3(d)
CONVENTIONAL

METHOD FOR FABRICATION OF MULTI-STEP STRUCTURES USING EMBEDDED ETCH STOP LAYERS

BACKGROUND OF THE INVENTION

This invention relates to a method of fabrication for multi-step microlithographic structures. More particularly, the invention is directed to a method of fabrication for multi-step microlithographic structures (e.g. Fresnel lenses used in acoustic ink printing applications) whereby the process includes the formation of intermediate etch stop layers within the block from which the structure is formed. In one embodiment, the method includes forming such layers by depositing etch material in-situ with Fresnel lens material. This is accomplished in the invention by depositing the lens material using known techniques and then selectively altering the chemistry of the material being deposited to form the intermediate etch stop layers at suitable positions without interrupting the deposition process. In another embodiment, the etch stop layers are patterned between layers of lens material. In either case, the lens is then formed using masking, patterning and etching techniques.

While the invention is particularly directed to the art of fabrication of multi-step microlithographic structures including, as a specific example, Fresnel lens fabrication in the acoustic ink printing environment, and will thus be described with specific reference thereto, it will be appreciated that the invention may have usefulness in other fields and applications. In this regard, the fabrication method also applies to Fresnel lenses or other multi-step microlithographic structures for use in, for example, optical, mechanical and electromechanical devices and is not limited to the acoustic ink printing environment.

Nonetheless, multi-discrete-phase Fresnel elements have been proposed for optical applications. See Swanson et al., "Infrared Applications of Diffractive Optical Elements," *Holographic Optics: Design and Application*, SPIE Vol. 883, 1988, pp. 155–162. Indeed, Fresnel lens elements have been proposed for use specifically in connection with acoustic ink printing applications. In this regard, commonly assigned U.S. Pat. No. 5,041,849 to Quate et al., which is incorporated herein by this reference, discloses the use of Fresnel lenses in acoustic ink printing systems. In addition, commonly assigned U.S. Pat. No. 5,278,028 to Hadimioglu et al. and commonly assigned U.S. Pat. No. 5,779,751 to Wong, which are also incorporated herein by reference, disclose processes for fabricating Fresnel lenses.

Figure 1:
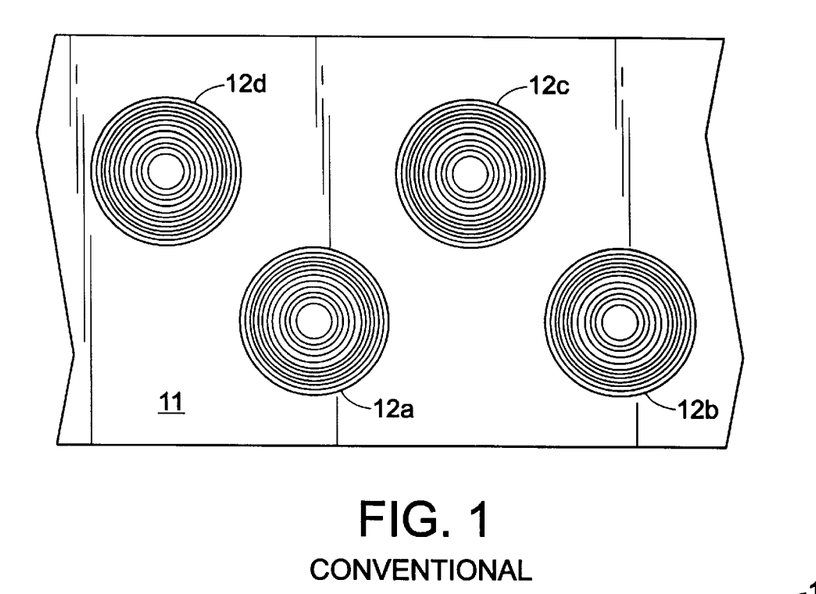
FIG. 1 is a partial view of an acoustic ink printhead having four-phase Fresnel lenses disposed thereon.

To specifically demonstrate an example of an environment of use for a Fresnel lens, FIG. 1 shows a portion of an exemplary acoustic ink printhead 11 comprising an array of substantially identical multi-discrete-phase binary Fresnel acoustic focussing lenses 12a–d. This particular printhead configuration is well suited for certain types of printing, such as line printing, but it should be appreciated that such printheads (or substantially similar printheads) are also applicable to other pertinent configurations for implementing a variety of different print modes.

Figure 2:
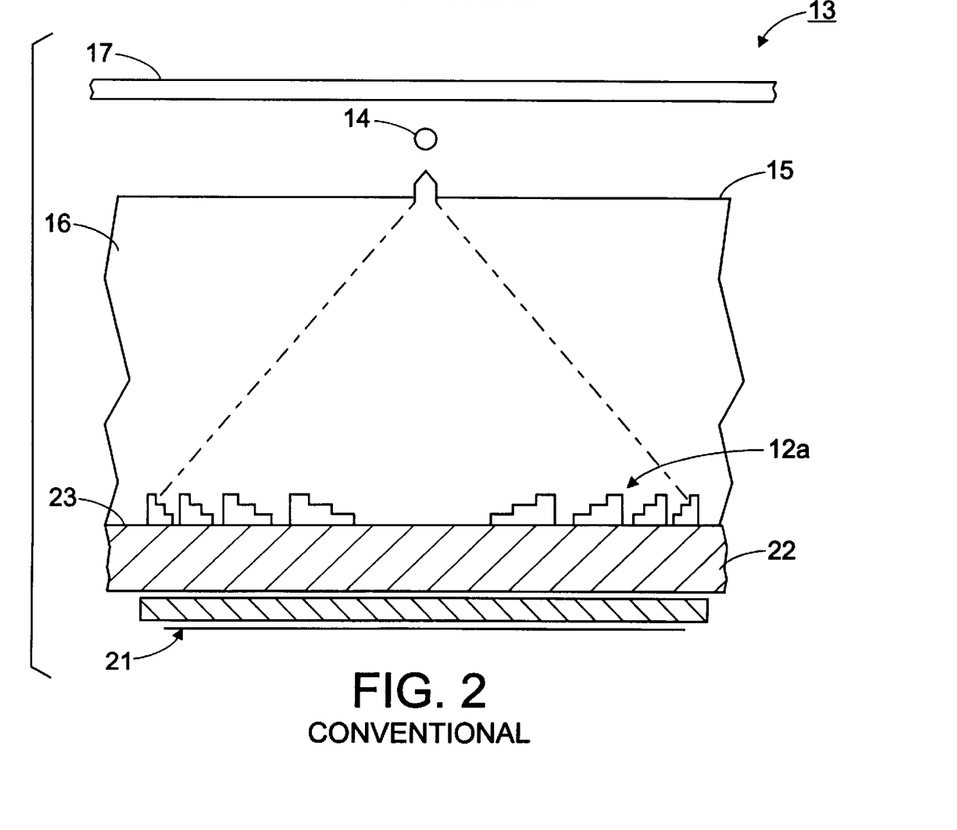
FIG. 2 is a sectional view of an acoustic ink print element having formed therein a four-phase Fresnel lens.
Figure 3A:
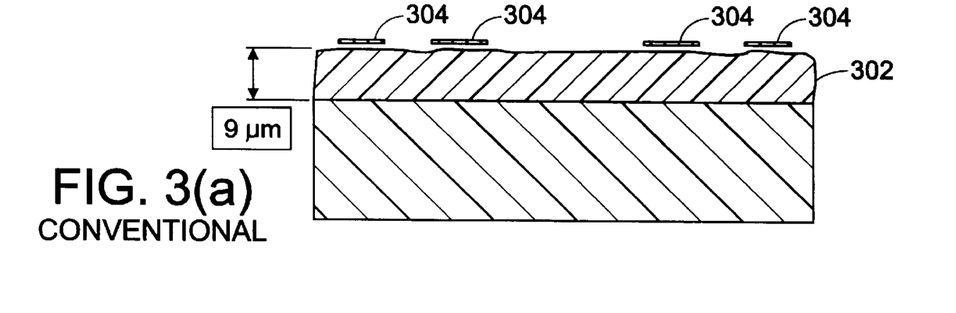
FIGS. 3(a)–(d) show a conventional method for fabrication of a four-phase Fresnel lens.
Figure 3B:
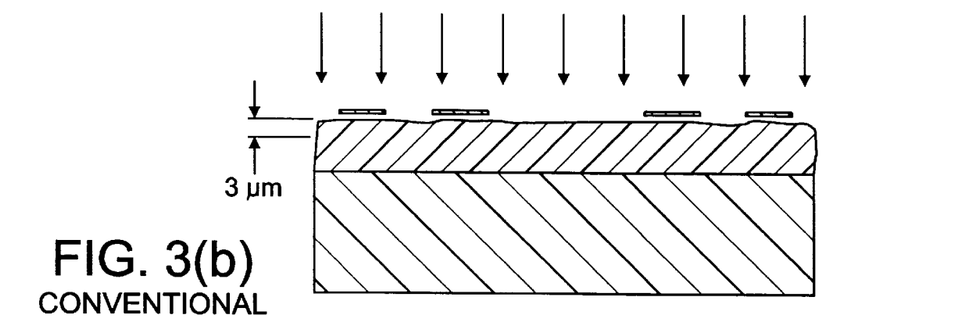
Figure 3C:
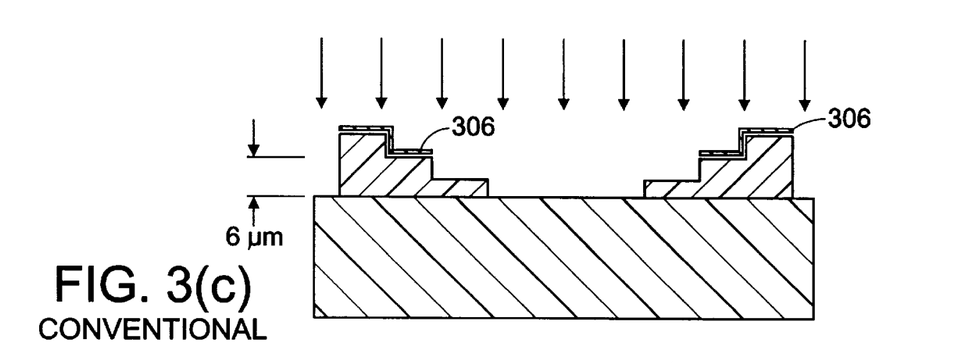
Figure 3D:
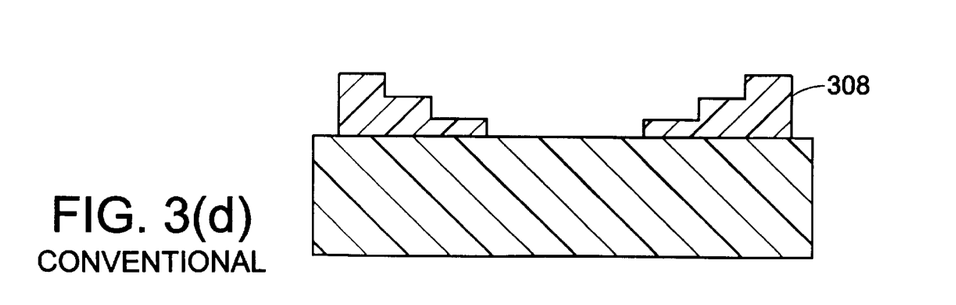

As shown in FIG. 2, the printhead 11 is embodied in an acoustic ink printer 13 for ejecting individual droplets of ink 14 from a free surface 15 of a pool of liquid ink 16 on demand at a sufficient ejection velocity to cause the droplets 14 to deposit in an image configuration on a nearby recording medium 17. To that end, the printhead 11 comprises a planar piezoelectric transducer 21 which is disposed on the rear face of an acoustically conductive substrate 22, such as a acoustically flat quartz, glass or silicon substrate. The opposite face of the substrate 22 has disposed thereon the concentric phase profiles of the Fresnel lens 12a which is generally representative of all lenses used. Sound waves are generated by the transducer 21 and focussed by the Fresnel lens toward the surface 15 of ink pool 16 to emit the droplets 14 therefrom.

As to the Fresnel lens, it should be appreciated that the representative lens 12a is a quantized approximation of the continuous phase profile of a theoretically ideal, 100% efficient, Fresnel phase plate. Accordingly, it will be evident that the acoustic focussing efficiency of the lens 12a and the width of its narrowest feature are dependent upon the number, n, of discrete phase levels to which its phase profiles is quantized. More specifically, as described in the above identified Swanson et al. article, two phase, four phase, eight phase and sixteen phase embodiments are approximately 41%, 81%, 95% and 99% efficient, respectively, for diffracting axial incident radiation into a focussed +1 diffraction order. A four phase Fresnel lens that is approximately 81% efficient has been determined to be acceptable for most acoustic ink printing applications.

There is a need for an economical and reliable process for manufacturing Fresnel lenses of the type noted herein that are in compliance with the design specifications of acoustic ink printing, for example. In this regard, typically, a four-phase Fresnel lens structure consists of three discrete steps. Depending on the process used, the thickness of each step may be determined by a time etch. In this case, uniformity may be compromised due to nonuniform etching characteristics resulting in over-etching and under-etching. Therefore, uniform etching is desired because overall ejector uniformity and Fresnel lens uniformity is critical to good print quality. Likewise, it is to be appreciated that uniformity and an economic and reliable process are also desired in applications other than Fresnel lens fabrication for acoustic ink printing.

The present invention contemplates a new and improved fabrication method for multi-step microlithographic structures including Fresnel lenses used in, for example, acoustic ink printing applications and other such structures used in other applications which resolves the above referenced difficulties and others.

SUMMARY OF THE INVENTION

A multi-step microlithographic structure fabrication method is provided which uses intermediate etch stop layers that are embedded in the material of the structure.

In one aspect of the invention, the method comprises steps of depositing a layer of a first material (onto a substrate) comprised of a plurality of elements or compounds supplied in first proportions, altering the first proportions of the plurality of elements or compounds to obtain a second material comprised of the plurality of elements or compounds supplied in second proportions, depositing an etch stop layer of the second material on the first material, altering the second proportions to again obtain the first material, and depositing another layer of the first material on the layer of the second material. These steps may be selectively repeated to form a block having embedded etch stop layers from which the structure may be formed.

In another aspect of the invention, etch stop layers are embedded between layers of material in a patterned fashion by depositing a layer of the first material and then patterning an etch stop layer thereon before depositing another layer of the first material. The process can be selectively repeated to build a block of material having embedded etch stop layers.

In another aspect of the invention, the method includes selectively masking and etching the block to form the structure.

In another aspect of the invention, the method is applied to fabrication of Fresnel lenses used in acoustic ink printing applications.

Further scope of the applicability of the present invention will become apparent from the detailed description provided below. It should be understood, however, that the detailed description and specific examples, while indicating preferred embodiments of the invention, are given by way of illustration only, since various changes and modifications within the spirit and scope of the invention will become apparent to those skilled in the art.

BRIEF DESCRIPTION OF THE DRAWINGS

The present invention exists in the construction, arrangement and combination, of various parts of the device and steps of the method, whereby the objects contemplated are obtained as hereinafter more fully set forth, specifically pointed out in the claims, and illustrated in the accompanying drawings in which:

DETAILED DESCRIPTION OF THE PREFERRED EMBODIMENTS

The specific embodiments described herein relate to techniques useful in the fabrication of Fresnel lenses as applied to acoustic ink printing applications. It is to be appreciated, however, that the steps disclosed may also be suitably applied to the fabrication of Fresnel lenses for light optics or other multi-step microlithographic structures for optical, mechanical, and/or electromechanical devices, for example.

With reference to FIGS. 3(a)–(d), which show a cross-sectional slice of a single lens element, a fabrication method for a four-phase Fresnel lens is shown. Initially, a film 302 is deposited whose thickness corresponds to a total height of the lens, e.g. 9 $\mu$m, and a mask 304 is patterned (FIG. 3(a)). It is to be appreciated that the mask comprises annular rings to correspond to the ring-like shape of the lenses as shown in FIG. 1. Next, the film is etched to a depth according to an n/2 phase shift, or about 3 $\mu$m, in the case of oxynitride (FIG. 3(b)). The first mask is then stripped off, a second mask 306 is patterned and etching continues for 6 $\mu$m to finally realize the four-phase Fresnel lens structure 308 (FIGS. 3(c) and (d)).

Figure 4A:
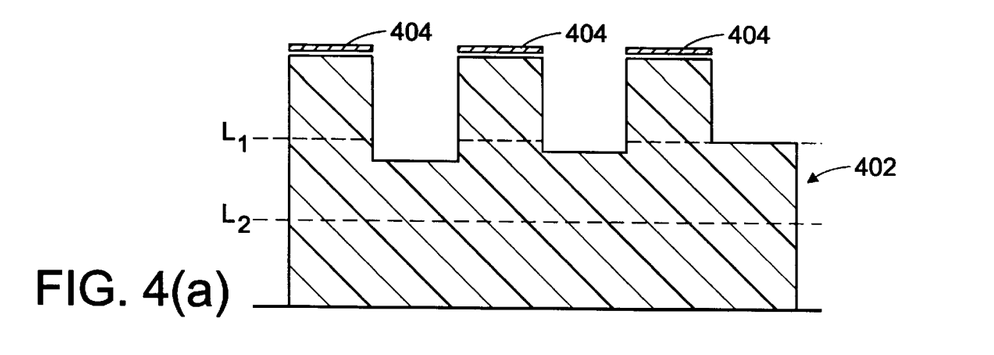
FIGS. 4(a)–(c) illustrate problems of improperly etching in connection with conventional Fresnel lens fabrication.
Figure 4B:
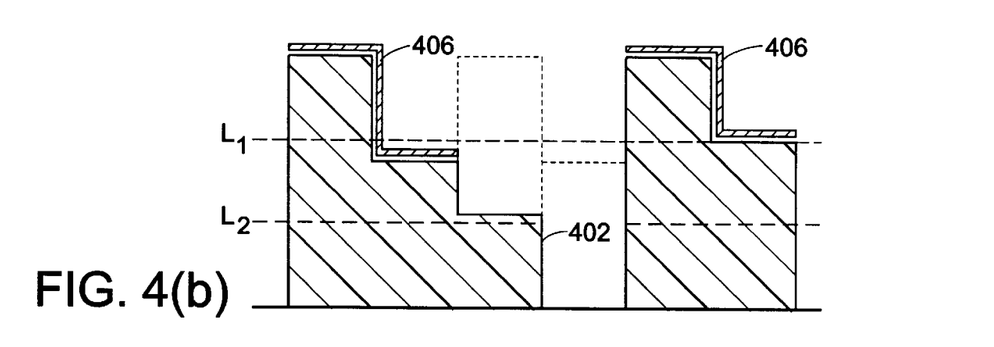
Figure 4C:
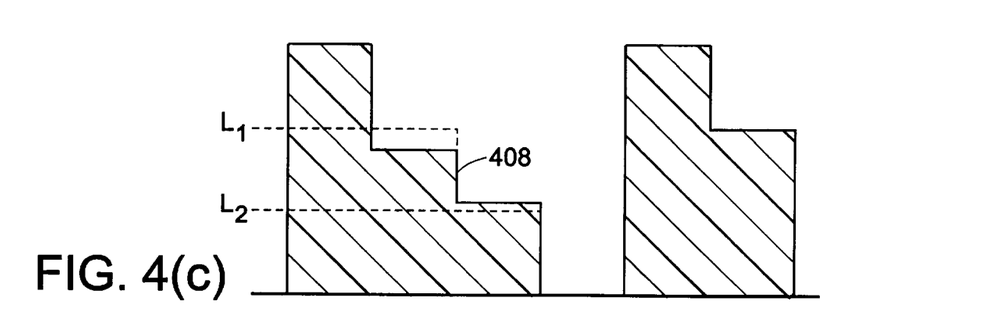
Figure 5A:
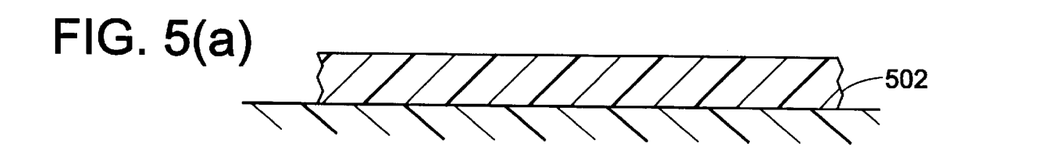
FIGS. 5(a)–(e) illustrate a deposition process according to the present invention.
Figure 5B:
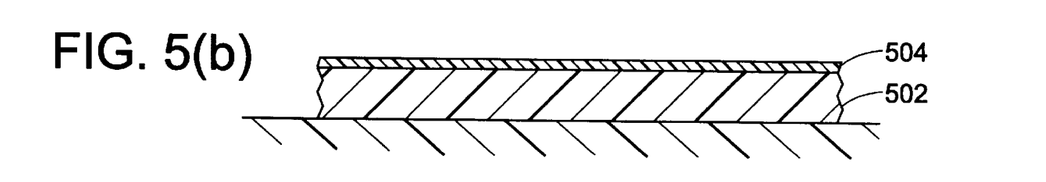
Figure 5C:
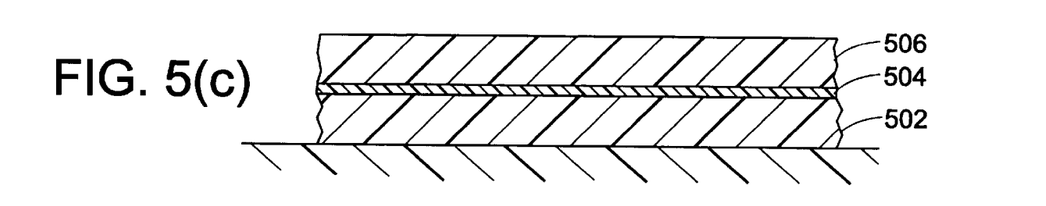
Figure 5D:
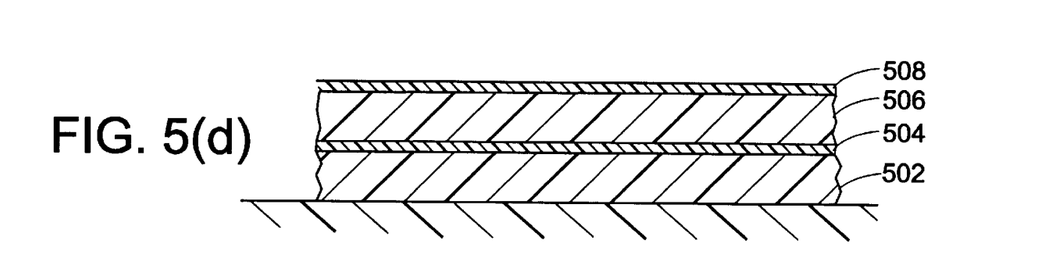
Figure 5E:
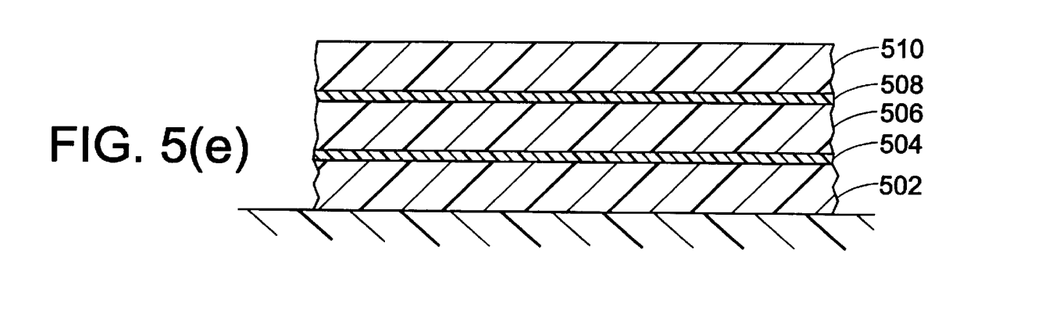

The above process, however, is subject to over-etching and under-etching which causes undesired nonuniformity in fabricating an array of identical lenses. This is demonstrated in FIGS. 4(a)–(c) (illustrating a cross-sectional slice of portions of lens elements) which show that, after a first etch of a material 402 using a mask 404, the desired level L1 may not be reached uniformly across the substrate 402, i.e., 0.5 $\mu$m over-etch (FIG. 4(a)). Another difficulty is exemplary illustrated by the under-etching shown after patterning a second mask 406 and etching in accordance therewith to the second etch level L2 (FIG. 4(b)). As a result, the discrete steps of the resultant Fresnel lens structure 408 do not have uniform or desired heights due to an improper phase shift and will be a cause of poor printing quality in a printing environment (FIG. 4(c)).

Referring now to the FIG. 5(a)–8(e) wherein the drawings are for purposes of illustrating the preferred embodiments of the invention only, and not for purposes of limiting same, FIGS. 5(a)–(e) provide an illustration of a process of depositing the lens material to form a block from which a four-phase Fresnel lens will be formed according to the present invention. While the description herein relates to a four-phase Fresnel lens which requires three layers of lens material and two etch stop layers, it is to be appreciated that the numbers of layers may be varied according to the number of phases of the Fresnel lens being formed.

Preferably, the material used to form the Fresnel lens is silicon oxynitride (SiON). It is also to be appreciated that various elements and/or compounds could be used as an alternative to silicon oxynitride. Nonetheless, to form the SiON material, the process includes the use of specified proportions of the following compounds: silane ($SiH_4$), nitrous oxide ($N_2O$), and ammonia ($NH_3$). The reaction product resulting from the plasma activation of the mixture of these specified proportions causes deposition to build the primary portions of the block from which the lens will ultimately be formed.

As will be demonstrated below, these proportions of the compounds can be selectively altered to change the chemistry of that which is being deposited (SiON) to form a second material having a significantly slower etch rate. The second material is then deposited as etch stop layers. The advantage of this process is that the etch stop layers are formed during the deposition process in-situ with the lens material so no unnecessary interruptions and/or delays occur.

More particularly, the deposition process is preferably performed using a plasma enhanced chemical vapor deposition (PECVD) method. It should be recognized, however, that sputter deposition or vacuum evaporation of alternating high/low etch-rate layers may be alternatives.

In the preferred PECVD process, plasma is used to release hydrogen atoms from the $SiH_4$ molecules so that the remaining free radicals will bond to form solid compounds (i.e. SiON). To form etch stop layers, the chemistry of the plasma may be altered such that an etch resistant layer is deposited by, for example, increasing the flow of $SiH_4$ to provide a silicon rich oxynitride—which etches much slower than the SiON. An amorphous silicon may also be formed as an etch stop layer.

FIGS. 5(a)–(e) illustrate the deposition process that is used to form the substrate material that is ultimately patterned and etched to form a four-phase Fresnel lens according to the present invention. As shown, a layer 502 of SiON is first deposited on a substrate, preferably to a thickness of 3 $\mu$m (FIG. 5(a)). The proportions of the compounds comprising SiON are then altered, or chemistry thereof changed, to obtain a a second, slower etching material which is deposited in a layer 504, preferably to a thickness of about 0.1–0.2 µm (FIG. 5(b)). Next, the chemistry of the etch stop material is altered back to the original SiON proportions to obtain SiON which is then deposited over the etch stop layer 504, preferably in a layer 506 having a thickness of approximately 3 µm (FIG. 5(c)). The proportions of the materials used to form the SiON is again altered to obtain the second slower etching material which is deposited in a layer 508, preferably to a thickness of 0.1–0.2 µm (FIG. 5(d)). Last, the chemistry is altered again in similar fashion and a layer 510 of SiON is deposited, preferably to a thickness of 3 µm (FIG. 5(e)).

It is to be appreciated that the altering of the compound proportions to change the chemistry of the material comprising the SiON and form an etch stop layer could be accomplished a number of different ways. Of course, the primary constraint on any such design choices is that the etch stop layer be of a composition that is etch resistant relative to the material that is being deposited as lens or primary material (e.g. SiON in the preferred embodiment).

It is further to be appreciated that an n-phase Fresnel lens may be formed, not simply the exemplary 4-phase device. In this case, (n−1) substrate layers with intermediate etch stop layer should be formed.

Referring now to FIGS. 6(a)–(d), an example of a masking and etching process using the substrate similar to that formed in FIGS. 5(a)–(e) is shown. Only a portion of the material and a cross-sectional slice of only portions of two lens elements are shown. It is recognized that a variety of masking and etching processes could be used depending on the application and/or number of phases. The described process is but one such process.

Figure 6A:
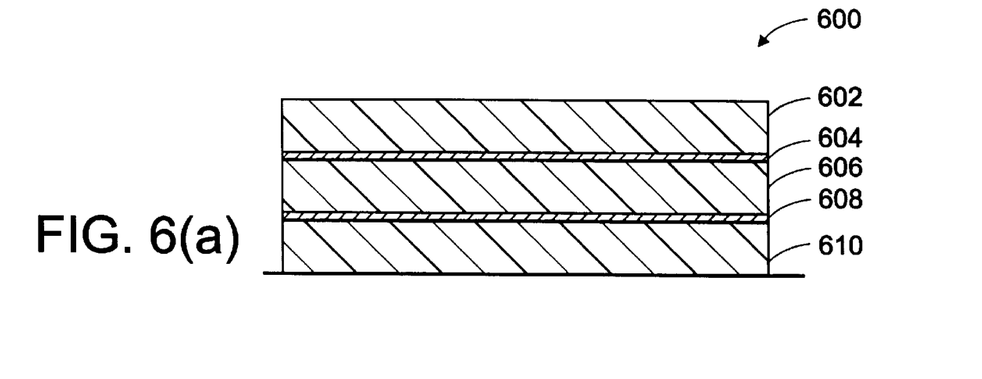
FIGS. 6(a)–(d) illustrate an exemplary method for forming a Fresnel lens according to the present invention.
Figure 6B:
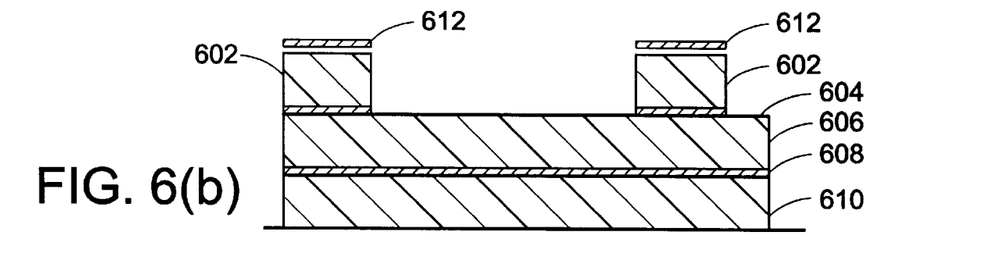
Figure 6C:
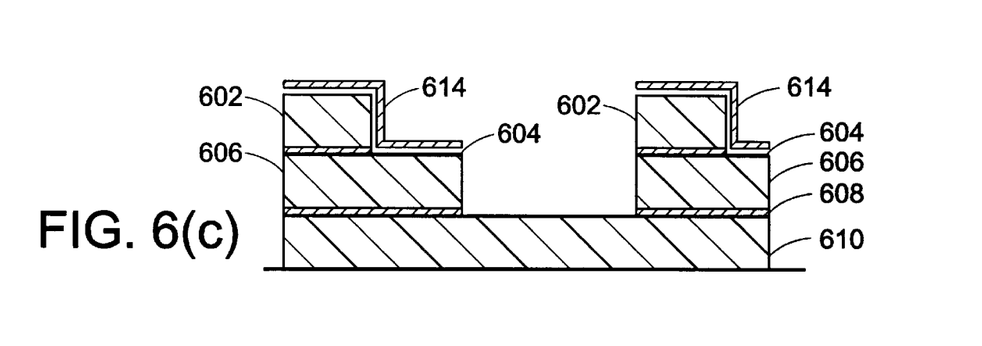
Figure 6D:
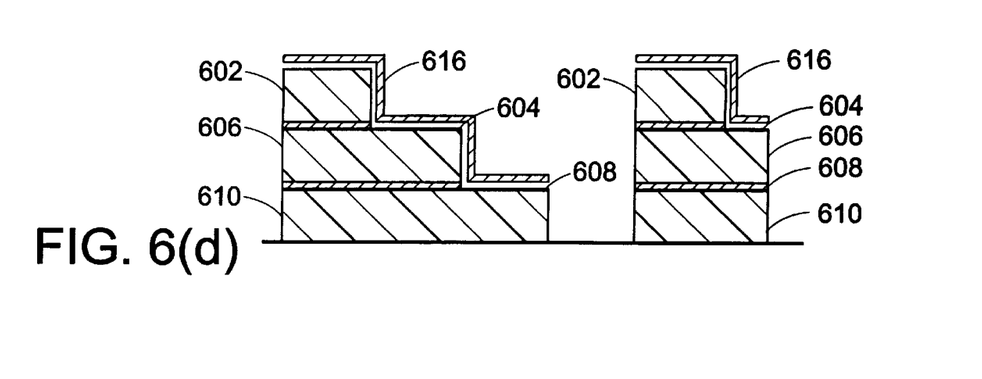
Figure 7A:
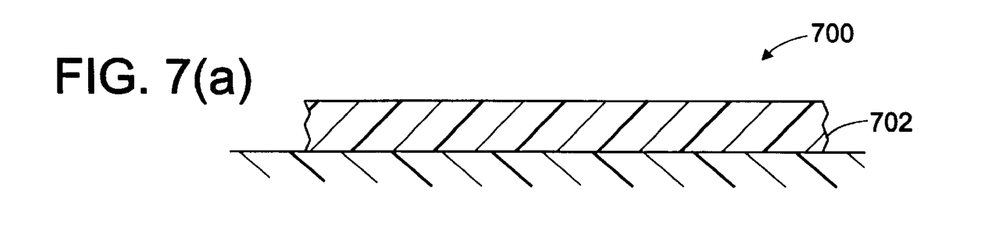
FIGS. 7(a)–(e) illustrate a formation process according to the present invention; and, FIGS. 8(a)–(e) illustrate an exemplary method for forming a Fresnel lens according to the present invention.
Figure 7B:
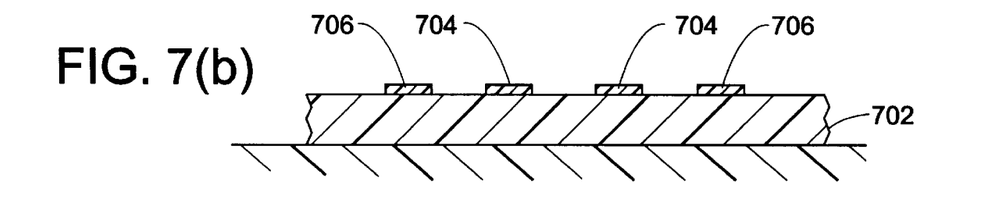
Figure 7C:
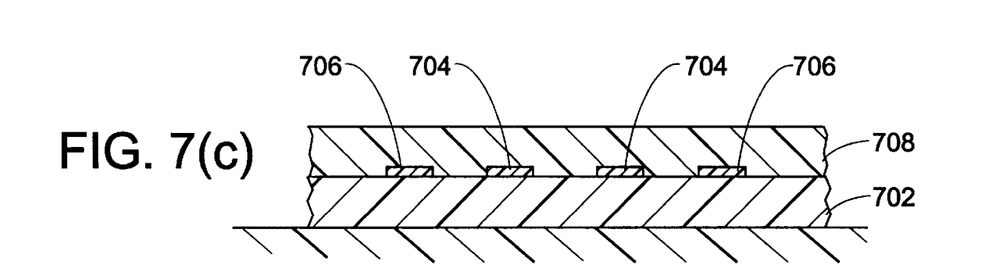
Figure 7D:
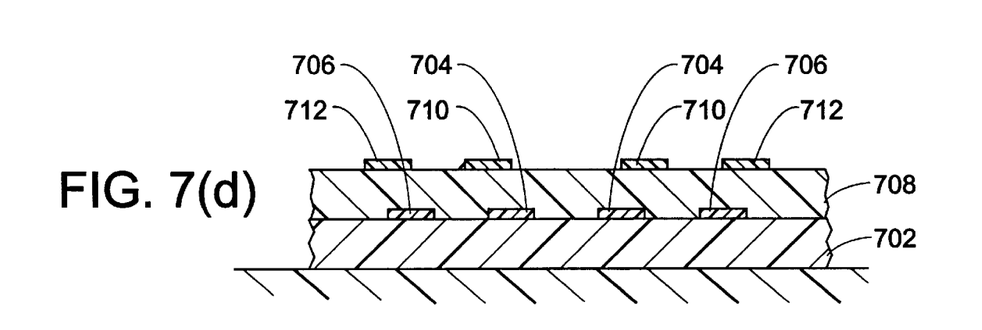
Figure 7E:
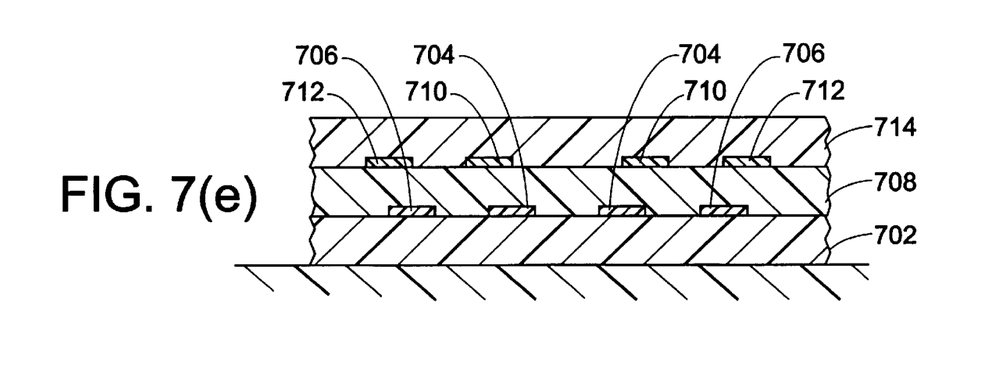

The process starts with a substrate block 600 comprised of layers of SiON 602, 606, and 610 and intermediate etch stop layers 604 and 608 (FIG. 6(a)). A mask 612, as well as masks 614 and 616, comprises annular ring portions corresponding to the ring-like shape of the lenses to be formed. The mask 612 is applied to the block 600 (i.e. layer 602)—leaving areas unmasked or exposed—and the SiON is etched (in areas corresponding to unmasked layers) until the etch stop layer 604 is encountered (FIG. 6(b)). It is to be appreciated that the etch stop layer 604 will allow for over-etching because the etch stop layer 604 etches at a slower rate than the SiON of layer 602. So, any nonuniformity in etching can be accommodated because the etching of all of the SiON of layer 602 can be accomplished while the etching of the etch stop layer 604 proceeds but does not complete.

The first mask 612 is removed. A second mask 614 is then patterned over the layers 602 and 604 and the etching of exposed areas continues by first etching through the remaining portions of the first etch stop layer 604 and then etching through the underlying portions of the layer 606 into the second etch stop layer 608 (FIG. 6(c)). Similar to encountering the first etch stop layer 604, encountering second etch stop layer 608 will compensate for the nonuniformities of etching the SiON layer 606. The second mask 614 is removed and a third mask 616 is patterned over layers 602, 604, 606 and 608 so that the etching of the remainder of exposed areas of the second etch stop layer 608 and the underlying SiON layer 610 can be completed (FIG. 6(d)).

Those of skill in the art will recognize that the process of etching through the etch stop layers to remove remaining portions thereof to expose underlying materials, as described above, may be accomplished in a variety of manners. Preferably, the same etch chemistry used for etching the lens material is used. In these circumstances, the etch stop layer simply etches slower than the lens material. If it is desirable to increase the etch rate, the chemistry of the etching material could be altered. Alternatively, the etch technique could be changed for this process. For example, a plasma etch could be replaced with a wet etch technique for purposes of etching through the etch stop layer.

It is to be appreciated that the method of FIGS. 6(a)–(d) adds one mask when compared to the process shown in FIGS. 3(a)–(d). Since device uniformity is critical to the overall print uniformity in the exemplary context disclosed, the additional mask is considered to be an acceptable consequence relative to the gain achieved in obtaining improved uniformity in the Fresnel lens fabrication process. In addition, use of three mask patterns allows for unequal step heights and relaxed requirements for etch selectivity and etch stop layer thickness while still achieving the desired uniformity.

The method disclosed in FIGS. 6(a)–(d) may present difficulties with respect to patterning the illustrated masks. Specifically, patterning the second and third masks may be problematic because certain methods of spinning resist do not allow for uniform application of the resist over the uneven surface created by the first etch. This, in turn, causes exposure, and consequently, patterning problems. A solution is to utilize planarization techniques to obtain uniform resist layers.

Alternatively, a two mask scheme similar to the three mask scheme above could be used provided that the step heights are close in thickness. These alternatives are merely exemplary and it is recognized that a variety of other masking procedures that will be apparent to those skilled in art could also be used to form the four-phase Fresnel lens from the block formed according to FIGS. 5(a)–(c).

An additional embodiment of the present invention involves the use of embedded etch stop layers as well. However, in this embodiment, the etch stop layers are not formed by altering the chemistry of the material being deposited as the primary lens material. Rather, the etch stop layers are patterned onto layers of the primary lens material during formation of the block from which the lens is formed. Hard stops useful in the etching process are thus formed.

More particularly, with reference to FIG. 7(a)–(e), a process 700 for forming a block of material is shown. A layer of lens material 702, having an etch rate, is first deposited on a substrate (FIG. 7(a)). Deposition of the first material may be accomplished in a variety of ways including a PECVD process, sputter deposition or vacuum evaporation. For ease of reference, a cross section of only a portion of the block being formed is shown. Next, a pattern of a second, or etch stop, material 704 and 706 is formed using known masking and/or patterning techniques (FIG. 7(b)). This pattern, of course, will be in the form of concentric rings (rings 704 and 706 shown) corresponding to the ring-like, or annular, shape of the Fresnel lens being formed. The etch rate of the second material is preferably substantially less than that of the first material. If desired, the second material may even be of a composition that it is not effectively etched in the etch process. Another layer of lens material 708 is then deposited (FIG. 7(c)). A second pattern of etch stop material is then masked/patterned (FIG. 7(d)). It should be appreciated that this pattern includes rings of etch stop material that are slightly offset from the rings on the lower layer of the block to accommodate for the stepped nature of the Fresnel lens being formed. So, as shown, rings 710 and 712 are patterned. Last, a third layer of lens material 714 is deposited (FIG. 7(e)).

As with the previous embodiment, any number of layers may be formed. Likewise, any suitable material could be used. Any corresponding modifications or enhancements to the disclosed method based on any such alternatives will be appreciated by those skilled in the art.

As shown in FIGS. 8(a)–(e), the block formed in the process depicted in FIGS. 7(a)–(e) may be etched to form Fresnel lenses. FIGS. 8(a)–(e) show cross-sectional slices of two lens elements being formed. First, an appropriate annular pattern 802 is formed on the block using known techniques (FIG. 8(a)). Exposed lens material is then etched away and the etch stop material (e.g. rings 710 and 712) is encountered (FIG. 8(b)). As etching continues, the second group of etch stop rings (e.g. rings 704 and 706) is encountered (FIG. 8(c)). As the etching process is completed, the three step structures that comprise the lenses are also completed. The initial mask 802 is then removed using known techniques (FIG. 8(e)).

Figure 8A:
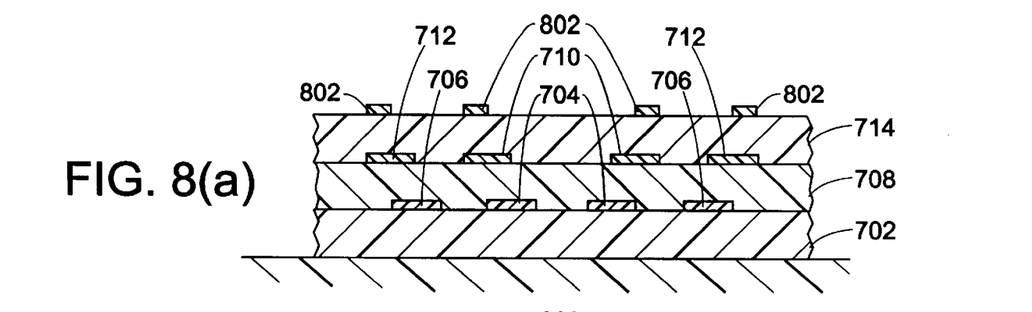
Figure 8B:
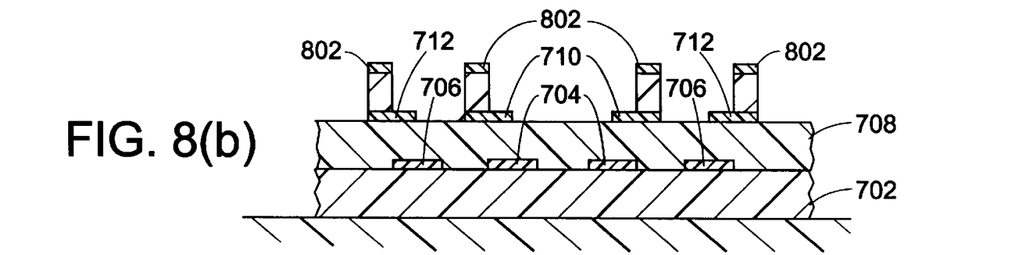
Figure 8C:
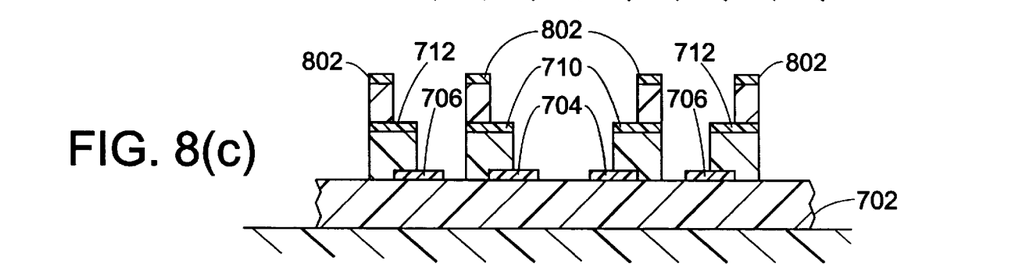
Figure 8D:
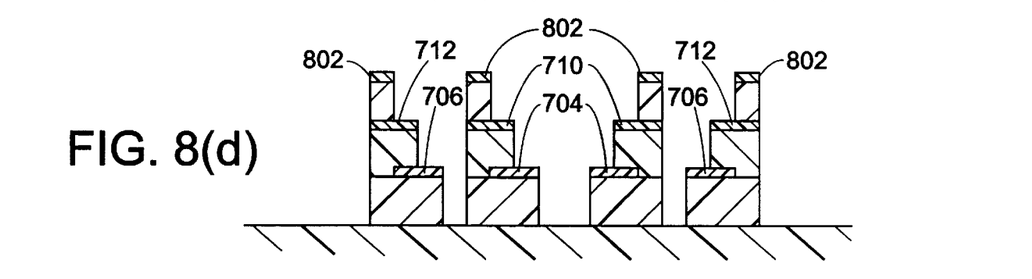
Figure 8E:
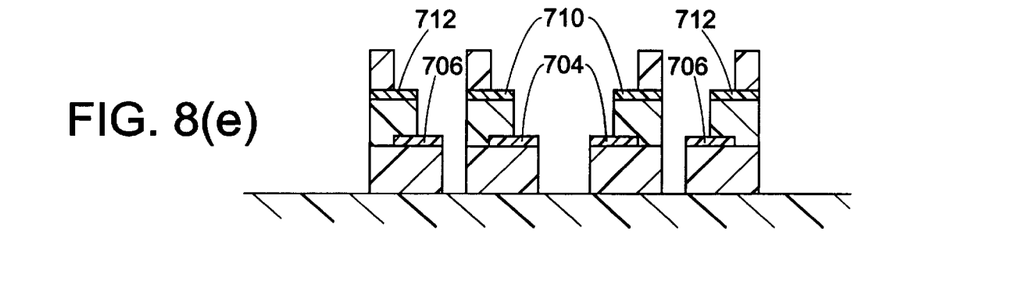

It is to be appreciated that the lens structures shown in FIG. 8(e) include steps having the etch stop material remaining thereon. Depending on the actual material used, the etch stop layer may or may not be entirely intact at the end of the process, i.e. some portion may be etched away. In any event, it should be of a composition so that it is able to act as a mask throughout the etching process. It may also be desirable in some circumstances to remove the remaining exposed portions of the etch stop layers.

An advantage of this process of FIGS. 7(a)–8(e) is that, once the etch stop layers are embedded, only a single masking stop is required thereafter to form the lens elements. This allows the etching process to proceed in an efficient manner.

The above description merely provides a disclosure of particular embodiments of the invention and is not intended for the purpose for limiting the same thereto. As such, the invention is not limited to only the above described embodiments. Rather, it is recognized that one skilled in the art could conceive alternative embodiments which fall within the scope of the invention.

Having thus described the invention, we claim:

1. A method of forming a four-phase Fresnel lens for use in acoustic printing, the method comprising steps of:
   depositing a first layer of a first material comprised of a plurality of compounds supplied in first proportions, the first material being etchable at a first rate;
   altering the first proportions of the plurality of compounds to obtain a second material comprised of the plurality of compounds supplied in second proportions, the second material being etchable at a second rate less than the first rate;
   depositing a first layer of the second material on the first layer;
   altering the second proportions to obtain the first material;
   depositing a second layer of the first material on the first layer of the second material;
   altering the first proportions to obtain the second material;
   depositing a second layer of the second material on the second layer of the first material;
   altering the second proportions to obtain the first material;
   depositing a third layer of the first material on the second layer of the second material, the first, second and third layers of the first material and the first and second layers of the second material comprising a block; and,
   selectively masking and etching the block to form the lens.

2. The method of claim 1 wherein the first material is silicon oxynitride.

3. The method of claim 2 wherein the compounds are silane, nitrous oxide and ammonia.

4. The method of claim 3 wherein altering the first proportions includes increasing an amount of silane.

5. The method of claim 1 wherein the selective masking and etching includes
   masking a first pattern on the third layer of first material leaving areas of the first material exposed;
   etching portions of the first material corresponding to the exposed areas and underlying portions of the second layer of the second material until all of the first material corresponding to the exposed areas is removed;
   masking a second pattern on the third layer of the first material and the second layer of the second material leaving areas of the second layer of the second material exposed;
   etching portions of the second material corresponding to the exposed areas, underlying portions of the second layer of the first material, and underlying portions of the first layer of the second material until all of the second material corresponding to the exposed areas and the underlying first material is removed;
   masking a third pattern on the third layer of the first material, the second layer of the second material, the second layer of the first material and the first layer of the second material leaving areas of the first layer of the second material exposed; and,
   etching portions of the second material corresponding to the exposed areas and underlying portions of the first layer of the first material until all of the underlying first material is removed.

6. A method of forming a four-phase Fresnel lens for use in acoustic printing, the method comprising steps of:
   depositing a first layer of a first material comprised of a plurality of compounds supplied in first proportions, the first material being etchable at a first rate;
   altering the first proportions of the plurality of compounds to obtain a second material comprised of the plurality of compounds supplied in second proportions, the second material being etchable at a second rate less than the first rate;
   depositing a first layer of the second material on the first layer;
   altering the second proportions to obtain the first material;
   depositing a second layer of the first material on the first layer of the second material;
   altering the first proportions to obtain the second material;
   depositing a second layer of the second material on the second layer of the first material;
   altering the second proportions to obtain the first material;
   depositing a third layer of the first material on the second layer of the second material, the first, second and third layers of the first material and the first and second layers of the second material comprising a block;
   masking a first pattern on the third layer of first material leaving areas of the first material exposed;
   etching portions of the first material corresponding to the exposed areas and underlying portions of the second layer of the second material until all of the first material corresponding to the exposed areas is removed;
   masking a second pattern on the third layer of the first material and the second layer of the second material leaving areas of the second layer of the second material exposed;

etching portions of the second material corresponding to the exposed areas, underlying portions of the second layer of the first material, and underlying portions of the first layer of the second material until all of the second material corresponding to the exposed areas and the underlying first material is removed;

masking a third pattern on the third layer of the first material, the second layer of the second material, the second layer of the first material and the first layer of the second material leaving areas of the first layer of the second material exposed; and, etching portions of the second material corresponding to the exposed areas and underlying portions of the first layer of the first material until all of the underlying first material is removed.

7. The method of claim 6 wherein the first material is silicon oxynitride.

8. The method of claim 7 wherein the compounds are silane, nitrous oxide and ammonia.

9. The method of claim 8 wherein altering the first proportions includes increasing an amount of silane.

10. A method of forming an n-phase Fresnel lens for use in acoustic printing, the method comprising steps of:

(a) depositing a layer of a first material comprised of a plurality of compounds supplied in first proportions, the first material being etchable at a first rate;

(b) altering the first proportions of the plurality of compounds to obtain a second material comprised of the plurality supplied in second proportions, the second material being etchable at a second rate less than the first rate;

(c) depositing a layer of the second material on the first layer;

(d) altering the second proportions to obtain the first material;

(e) depositing another layer of the first material on the layer of the second material;

(f) repeating steps (b) through (e) (n−3) times to form a block; and, (g) selectively masking and etching the block to form the n-phase lens.

11. The method of claim 10 wherein the first material is silicon oxynitride.

12. The method of claim 11 wherein the compounds are silane, nitrous oxide and ammonia.

13. The method of claim 12 wherein altering the first proportions includes increasing an amount of silane.

14. A method of forming a Fresnel lens for use in acoustic printing, the method comprising steps of:

depositing a first layer of a first material, the first material being etchable at a first rate;

forming a first patterned layer of a second material on the first layer, the second material being etchable at a second rate less than the first rate;

depositing a second layer of the first material over the first patterned layer of the second material;

forming a second patterned layer of the second material on the second layer of the first material;

depositing a third layer of the first material on the second patterned layer of the second material, the first, second and third layers of the first material and the first and second patterned layers of the second material comprising a block; and, selectively masking and etching the block to form the lens.

15. The method of claim 14 wherein the first and second patterned layers comprise generally annular portions of the second material.

16. The method of claim 15 wherein the annular portions of the first patterned layer are vertically offset from the annular portions of the second patterned layer.

17. The method of claim 14 wherein the second rate is substantially less than the first rate.

18. The method of claim 14 wherein forming the first and second patterned layers comprises masking.

19. The method of claim 14 wherein depositing the first, second, and third layers of the first material comprise one of plasma enhanced chemical vapor deposition techniques, sputter deposition techniques and vacuum evaporation techniques.

20. The method of claim 14 wherein the selective masking requires application of only a single mask to the block to form the lens.

21. A method of forming an n-phase microlithographic structure, the method comprising steps of:

(a) depositing a layer of a first material comprised of a plurality of compounds supplied in first proportions, the first material being etchable at a first rate;

(b) altering the first proportions of the plurality of compounds to obtain a second material comprised of the plurality supplied in second proportions, the second material being etchable at a second rate less than the first rate;

(c) depositing a layer of the second material on the first layer;

(d) altering the second proportions to obtain the first material;

(e) depositing another layer of the first material on the layer of the second material;

(f) repeating steps (b) through (e) (n−3) times to form a block; and, (g) selectively masking and etching the block to form the n-phase structure.

22. A method of forming a multi-step microlithographic structure, the method comprising steps of:

depositing a first layer of a first material, the first material being etchable at a first rate;

forming a first patterned layer of a second material on the first layer, the second material being etchable at a second rate less than the first rate;

depositing a second layer of the first material over the first patterned layer of the second material;

forming a second patterned layer of the second material on the second layer of the first material;

depositing a third layer of the first material on the second patterned layer of the second material, the first, second and third layers of the first material and the first and second patterned layers of the second material comprising a block; and, selectively masking and etching the block to form the structure.

* * * * *